(12) United States Patent
Yang et al.

(10) Patent No.: US 11,698,191 B2
(45) Date of Patent: Jul. 11, 2023

(54) IGNITION METHOD OF PLASMA CHAMBER

(71) Applicant: DELTA ELECTRONICS, INC., Taoyuan (TW)

(72) Inventors: Kun-Han Yang, Taoyuan (TW); Chin-Chang Kuo, Taoyuan (TW); Wei-Hsun Lai, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 25 days.

(21) Appl. No.: 16/999,585

(22) Filed: Aug. 21, 2020

(65) Prior Publication Data

US 2021/0317989 A1    Oct. 14, 2021

(30) Foreign Application Priority Data

Apr. 13, 2020   (CN) .......................... 202010284549.3

(51) Int. Cl.
  *F23Q 7/22*   (2006.01)
  *H05H 1/46*   (2006.01)

(52) U.S. Cl.
  CPC ................ *F23Q 7/22* (2013.01); *H05H 1/46* (2013.01)

(58) Field of Classification Search
  None
  See application file for complete search history.

(56) References Cited

U.S. PATENT DOCUMENTS

| | | | | |
|---|---|---|---|---|
| 5,976,334 A | * | 11/1999 | Fu | ........................ C23C 14/3457 118/723 MA |
| 6,967,305 B2 | * | 11/2005 | Sellers | .............. H01J 37/32935 219/121.36 |
| 7,115,185 B1 | * | 10/2006 | Gonzalez | .............. H01J 37/321 156/345.44 |
| 7,422,664 B2 | * | 9/2008 | Ritchie | ............. H01J 37/32009 204/192.12 |
| 7,671,305 B2 | | 3/2010 | Chodacki et al. | |
| 9,905,399 B2 | * | 2/2018 | Ramm | ................... H05B 7/148 |
| 10,111,315 B1 | * | 10/2018 | Lai | ............................ H01J 37/32 |
| 10,475,622 B2 | | 11/2019 | Pankratz et al. | |
| 10,621,472 B1 | * | 4/2020 | Buibas | ...................... G06T 3/40 |
| 10,886,104 B2 | * | 1/2021 | Huff | .................. H01J 37/32009 |
| 2003/0159782 A1 | * | 8/2003 | Brcka | ............... H01J 37/32623 438/758 |
| 2005/0040144 A1 | * | 2/2005 | Sellers | .............. H01J 37/32935 219/121.57 |
| 2005/0157451 A1 | * | 7/2005 | Kuo | ..................... H01R 25/003 361/628 |

(Continued)

FOREIGN PATENT DOCUMENTS

CN    105201657 B    9/2017
CN    110138362 A    8/2019
(Continued)

*Primary Examiner* — Srinivas Sathiraju
(74) *Attorney, Agent, or Firm* — Muncy, Geissler, Olds & Lowe, P.C.

(57) ABSTRACT

An ignition method of a plasma chamber includes steps of: (a) starting softly an ignition voltage to a first voltage, (b) decreasing the magnitude of the ignition voltage to a second voltage after a first ignition time, (c) increasing the magnitude of the ignition voltage to the first voltage after a second ignition time, and (d) repeating the step (b) and the step (c) until the ignition is successful.

7 Claims, 7 Drawing Sheets

(56) References Cited

U.S. PATENT DOCUMENTS

| | | | |
|---|---|---|---|
| 2005/0190154 A1* | 9/2005 | Kuo | G06F 3/03543 |
| | | | 345/163 |
| 2006/0011763 A1* | 1/2006 | Kuo | B65H 75/4434 |
| | | | 242/378.1 |
| 2007/0181063 A1* | 8/2007 | Ritchie | H01J 37/32009 |
| | | | 118/723 E |
| 2010/0243607 A1 | 9/2010 | Ohse et al. | |
| 2010/0327099 A1* | 12/2010 | Kuo | A61P 35/00 |
| | | | 242/378 |
| 2015/0053645 A1* | 2/2015 | Okumura | H01J 37/32935 |
| | | | 156/345.44 |
| 2018/0167898 A1* | 6/2018 | Lai | H03F 1/0222 |
| 2020/0019921 A1* | 1/2020 | Buibas | G06T 19/003 |
| 2020/0388466 A1* | 12/2020 | Huff | H01J 37/32009 |
| 2020/0412244 A1* | 12/2020 | Lai | H02M 3/158 |
| 2021/0006150 A1* | 1/2021 | Lai | H02M 1/34 |
| 2021/0109026 A1* | 4/2021 | Koppenaal | G01N 21/67 |
| 2021/0317989 A1* | 10/2021 | Yang | H05H 1/46 |
| 2022/0102067 A1* | 3/2022 | Lai | H01F 27/29 |
| 2022/0234463 A1* | 7/2022 | Hsu | H02H 3/207 |

FOREIGN PATENT DOCUMENTS

| | | | | |
|---|---|---|---|---|
| DE | 102011016681 A1 * | 10/2012 | | C23C 14/325 |
| TW | 201108871 A | 3/2011 | | |
| TW | 201218149 A | 5/2012 | | |

\* cited by examiner

IGNITION METHOD OF PLASMA CHAMBER

BACKGROUND

Technical Field

The present disclosure relates to an ignition method of a plasma chamber, and more particular to an ignition method of a plasma chamber capable of dynamically adjusting ignition voltages.

Description of Related Art

The statements in this section merely provide background information related to the present disclosure and do not necessarily constitute prior art.

The power source of semiconductor equipment can be divided into DC, intermediate frequency (IF), radio frequency (RF), and microwave power sources. When the power source activates, a large excitation source is usually provides. Since the process of generating plasma in the cavity requires enough energy to break the bonding of gas molecules or atoms, this excitation source can generally be high-voltage or high-frequency power source.

Figure 1A:
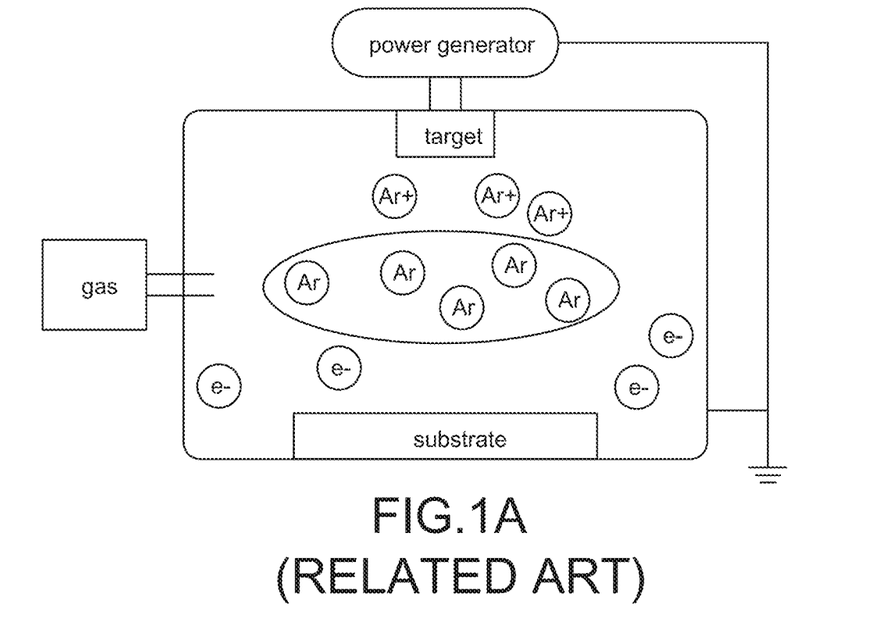
FIG. 1A is a schematic diagram of a conventional capacitive plasma ignition.
Figure 1B:
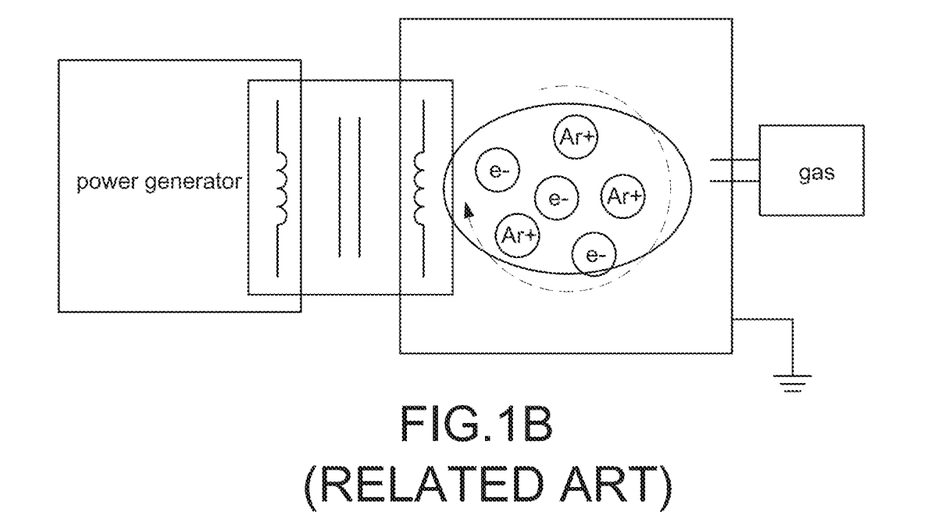
FIG. 1B is a schematic diagram of a conventional inductive plasma ignition.

Please refer to FIG. 1A and FIG. 1B. FIG. 1A shows a schematic diagram of a conventional capacitive plasma ignition, and FIG. 1B shows a schematic diagram of a conventional inductive plasma ignition. As shown in FIG. 1A, the gas (such as argon) is ionized by the high voltage to become positive ions and electron plasmas in the cavity. As shown in FIG. 1B, the gas (such as argon) is ionized by the high frequency to become positive ions and electron plasmas.

Figure 2A:
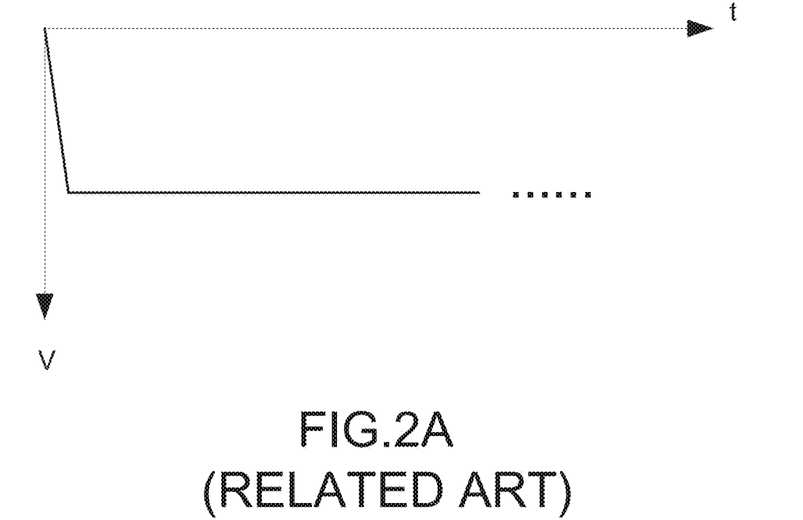
FIG. 2A is a schematic waveform of a conventional ignition manner by a DC power source.

Take a DC power source (or a pulse power source) as an example. Please refer to FIG. 2A, which shows a schematic waveform of a conventional ignition manner by a DC power source. Although it is easier to ionize gas to successfully ignite by directly supplying power with a higher voltage (such as 3000 volts), the high voltage provided may not be able to successfully ignite since the cavity is usually in a cooled state before the plasma is produced. Normally, if it fails to complete the ignition for a period of time, it will shut down. At the same time, the pressure, gas concentration, etc. in the cavity are adjusted to establish a better ignition environment, and then the ignition procedure is performed at a high voltage again. However, such an ignition manner will cause a longer ignition time, which makes the ignition efficiency poor. Furthermore, through high-voltage ignition, due to the effect of ion bombardment, it is easy to cause damage to the cavity, which reduces the life of the cavity.

Figure 2B:
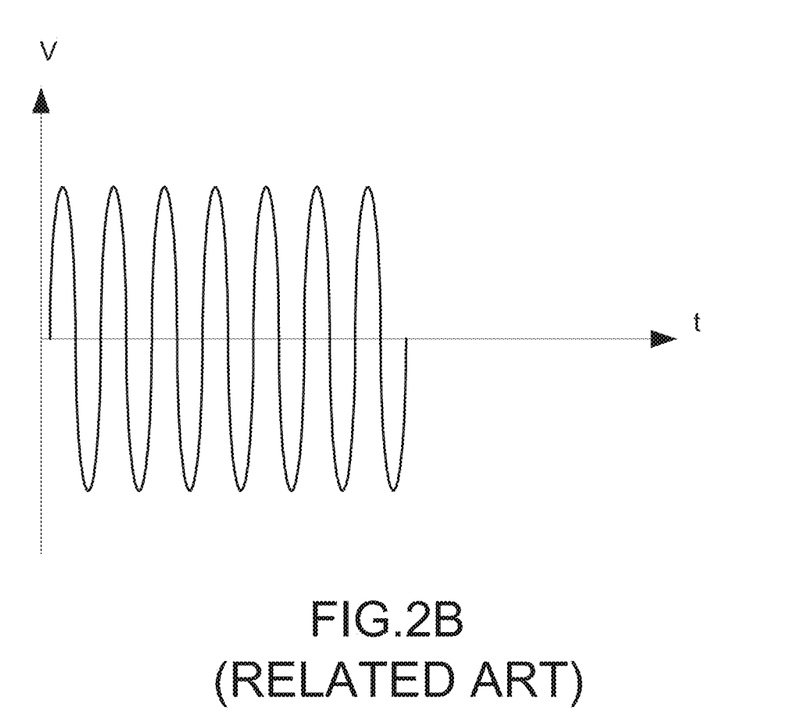
FIG. 2B is a schematic waveform of a conventional ignition manner by a sinusoidal-wave power source.

Further, take an intermediate frequency (IF) power source or a radio frequency (RF) power source as an example. Please refer to FIG. 2B, which shows a schematic waveform of a conventional ignition manner by a sinusoidal-wave power source. Although the power is supplied by a high-frequency voltage, the frequency and amplitude of this alternating power supply are fixed, so that when the positive half cycle of the gas is ionized, but the reduction occurs in the negative half cycle, thereby making the ignition failure and not easy to succeed.

Therefore, how to provide an ignition method of a plasma chamber, especially an ignition method of a plasma chamber that can dynamically adjust the ignition voltage, to solve the foregoing problems is an important subject studied by the inventors of the present disclosure.

SUMMARY

An object of the preset disclosure is to provide an ignition method of a plasma chamber to solve the problems in the related art.

In order to achieve the above-mentioned object, the ignition method of the plasma chamber includes steps of: (a) starting softly an ignition voltage to a first voltage, (b) decreasing the magnitude of the ignition voltage to a second voltage after a first ignition time, (c) increasing the magnitude of the ignition voltage to the first voltage after a second ignition time, and (d) repeating the step (b) and the step (c) until the ignition is successful.

In one embodiment, a ratio between the first ignition time continued with the first voltage and the second ignition time continued with the second voltage is adjustable.

In one embodiment, when the ignition voltage is a DC voltage and is negative, the magnitude of the first voltage is greater than the magnitude of the second voltage.

In one embodiment, in the repeating step, the latter of the magnitude of the first voltage is less than or equal to the former of the magnitude of the first voltage.

In one embodiment, in the repeating step, the latter of the magnitude of the second voltage is greater than or equal to the former of the magnitude of the second voltage.

In one embodiment, when the ignition voltage is a sinusoidal-wave voltage, the amplitude of the first voltage is greater than the amplitude of the second voltage.

In one embodiment, in the repeating step, the latter of the amplitude of the first voltage is less than or equal to the former of the amplitude of the first voltage.

In one embodiment, in the repeating step, the latter of the amplitude of the second voltage is greater than or equal to the former of the amplitude of the second voltage.

Accordingly, the ignition method of the plasma chamber is provided to obtain a more efficient ignition procedure and protect the cavity from damage to increase the life of the cavity by using the voltage variation rate with time compared with the conventional ignition procedure using a high voltage with a single voltage magnitude.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Reference will now be made to the drawing figures to describe the present disclosure in detail. It will be understood that the drawing figures and exemplified embodiments of present disclosure are not limited to the details thereof.

Figure 3A:
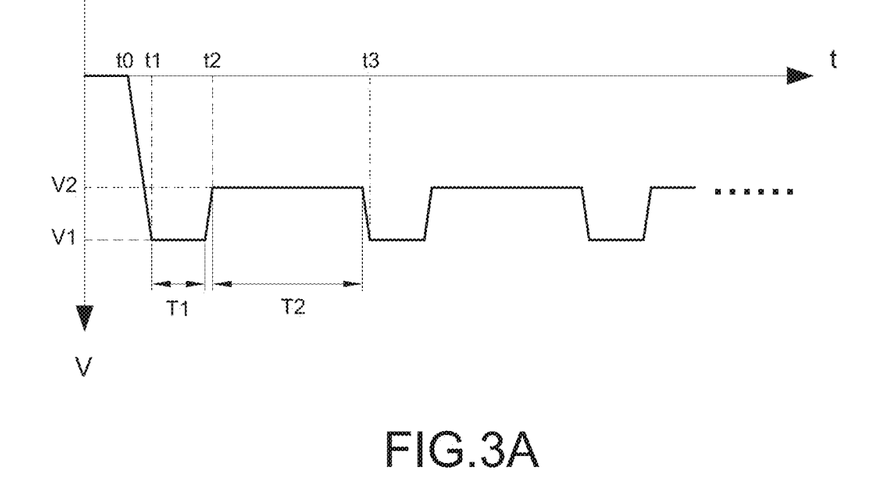
FIG. 3A is a schematic waveform of an ignition manner by a DC power source according to a first embodiment of the present disclosure.
Figure 5:
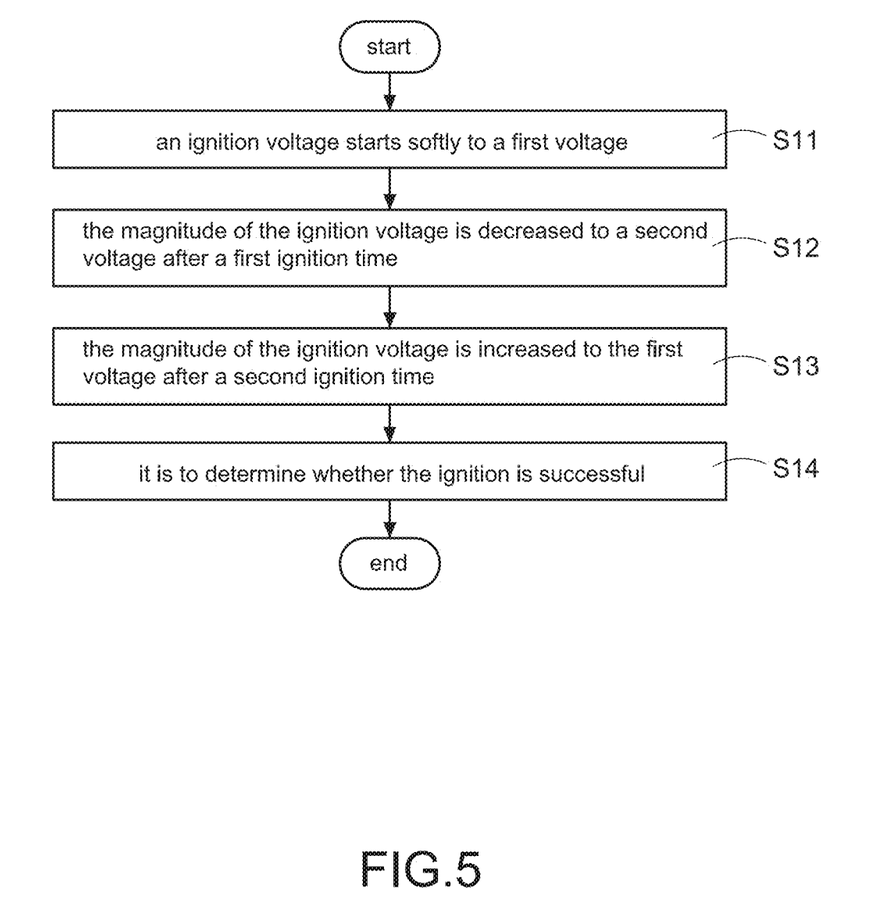
FIG. 5 is a flowchart of an ignition method of a plasma chamber according to the present disclosure.

In order to facilitate the explanation of the ignition method of the present disclosure, the DC power source is taken as an example first, and as shown in FIG. 3A, which is a schematic waveform of an ignition manner by a DC power source according to a first embodiment of the present disclosure, and also refer to FIG. 5, which is a flowchart of an ignition method of a plasma chamber according to the present disclosure. The ignition method of the plasma chamber includes steps as follows. First, an ignition voltage starts softly to a first voltage (S11). In particular, the DC power source uses negative voltage as an example. The relationship of step (S11) corresponding to FIG. 3A is: at a time point to, the ignition voltage starts softly, and at a time point t1, the ignition voltage reaches to a first voltage V1. For example, the first voltage V1 is −1900 volts (or a voltage between −1000 volts and −1900 volts), however, this is not a limitation of the present disclosure. Afterward, when the ignition voltage reaches to the first voltage V1, the magnitude of the ignition voltage is decreased to a second voltage after a first ignition time (S12). In particular, the first ignition time T1 is 10 milliseconds (or a time between 10 milliseconds and 1000 milliseconds), however, this is not a limitation of the present disclosure. The second voltage V2 reached at a time point t2 is −500 volts (or a voltage between −500 volts and −1000 volts), however, this is not a limitation of the present disclosure. In this embodiment, a slop from the first voltage V1 to the second voltage V2 is (V2−V1)/(t2−t1−T1). The ignition procedure using the voltage variation rate with time (i.e., dv/dt) is easier to make ignition successful compared with the conventional ignition procedure using a DC high voltage with a single voltage magnitude.

Afterward, the magnitude of the ignition voltage is increased to the first voltage after a second ignition time (S13). In particular, the second ignition time T2 is 200 milliseconds (or a time between 200 milliseconds and 1000 milliseconds), however, this is not a limitation of the present disclosure. In this embodiment, the first voltage V1 is fixed, and therefore the first voltage V1 reached at a time point t3 is the above-mentioned −1900 volts. In this embodiment, a slop from the second voltage V2 to the first voltage V1 is (V1−V2)/(t3−t2−T2). The ignition procedure using the voltage variation rate with time (i.e., dv/dt) is easier to make ignition successful. In particular, a ratio between the first ignition time T1 continued by the first voltage V1 and the second ignition time T2 continued by the second voltage V2 is adjustable.

Afterward, it is to determine whether the ignition is successful (S14). If no (i.e., the ignition is not successful), the step (S12) and step (S13) repeatedly perform, that is, the ignition procedure after the second cycle as shown in FIG. 3A. If yes (i.e., the ignition is successful), the ignition procedure is completed.

Figure 3B:
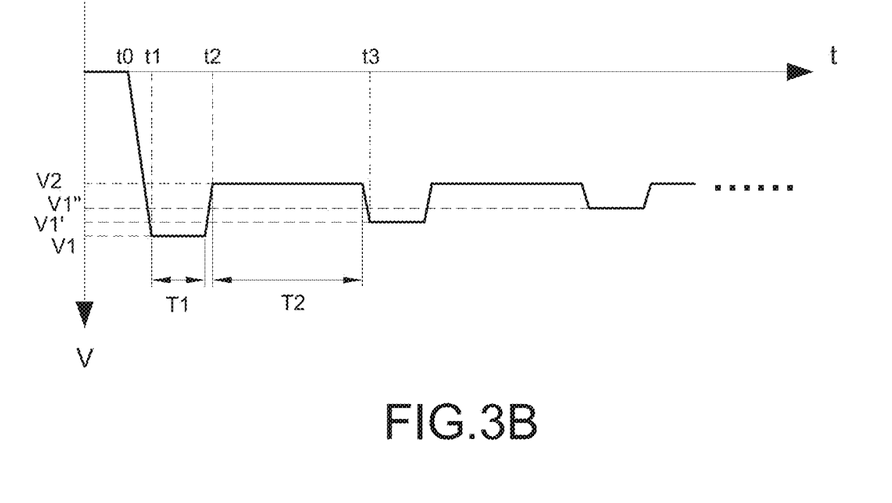
FIG. 3B is a schematic waveform of the ignition manner by the DC power source according to a second embodiment of the present disclosure.

Please refer to FIG. 3B, which shows a schematic waveform of the ignition manner by the DC power source according to a second embodiment of the present disclosure. In the embodiment shown in FIG. 3A, the first voltage V1 and the second voltage V2 are fixed, however, the first voltage V1,V1',V1" is unfixed but the second voltage V2 is fixed as shown in FIG. 3B.

As shown in FIG. 3B, at the time point t0, the ignition voltage starts softly, and at the time point t1, the ignition voltage reaches to the first voltage V1, such as −1900 volts. Afterward, the ignition voltage is increased to the second voltage V2, such as −500 volts after the first ignition time T1. In this embodiment, the ignition procedure using the voltage variation rate with time (i.e., dv/dt) is easier to make ignition successful. Therefore, a slop from the first voltage V1 to the second voltage V2 is (V2−V1)/(t2−t1−T1).

Afterward, the ignition voltage is decreased to the first voltage V1', such as −500 volts after the second ignition time T2. In this embodiment, since the first voltage V1 is unfixed, the first voltage V1' reached at the time point t3 is −1700 volts. Therefore, a slop from the second voltage V2 to the first voltage V1' is (V1'−V2)/(t3−t2−T2). The ignition procedure using the voltage variation rate with time (i.e., dv/dt) is easier to make ignition successful.

Afterward, it is to determine whether the ignition is successful. If no (i.e., the ignition is not successful), the step (S12) and step (S13) repeatedly perform, that is, the ignition procedure after the second cycle as shown in FIG. 3B. If yes (i.e., the ignition is successful), the ignition procedure is completed.

Figure 3C:
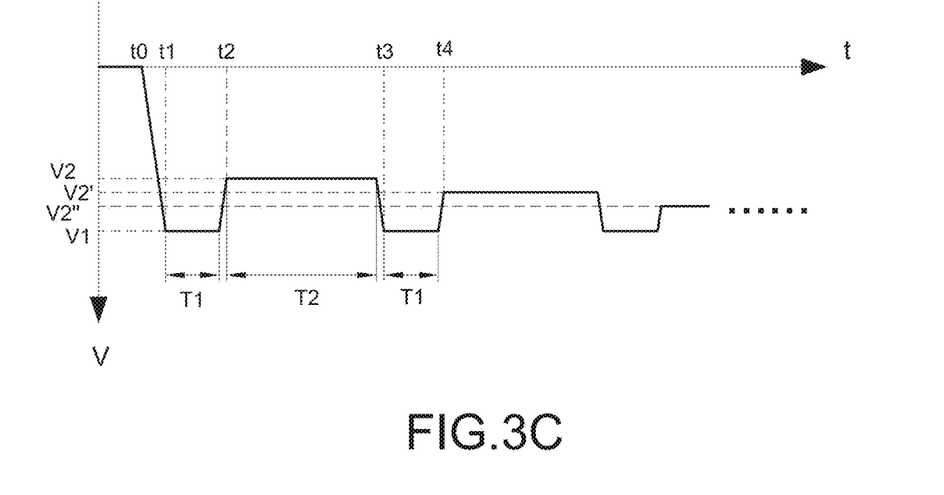
FIG. 3C is a schematic waveform of the ignition manner by the DC power source according to a third embodiment of the present disclosure.

Please refer to FIG. 3C, which shows a schematic waveform of the ignition manner by the DC power source according to a third embodiment of the present disclosure. In the embodiment shown in FIG. 3B, the first voltage V1,V1', V1" is unfixed but the second voltage V2 is fixed, however, the first voltage V1 is fixed but the second voltage V2,V2', V2" is unfixed as shown in FIG. 3C.

As shown in FIG. 3C, at the time point to, the ignition voltage starts softly, and at the time point t1, the ignition voltage reaches to the first voltage V1, such as −1900 volts. Afterward, the ignition voltage is increased to the second voltage V2, such as −500 volts after the first ignition time T1. In this embodiment, the ignition procedure using the voltage variation rate with time (i.e., dv/dt) is easier to make ignition successful. Therefore, a slop from the first voltage V1 to the second voltage V2 is (V2−V1)/(t2−t1−T1).

Afterward, the ignition voltage is decreased to the first voltage V1 after the second ignition time T2. In this embodiment, since the first voltage V1 is fixed, the first voltage V1 reached at the time point t3 is −1900 volts. Therefore, a slop from the second voltage V2 to the first voltage V1 is (V1−V2)/(t3−t2−T2). The ignition procedure using the voltage variation rate with time (i.e., dv/dt) is easier to make ignition successful.

Afterward, the ignition voltage is increased to the second voltage V2' after the first ignition time T1. In this embodiment, since the second voltage V2 is unfixed, the second voltage V2' reached at a time point t4 is −700 volts. Therefore, a slop from the first voltage V1 to the second voltage V2' is (V2'−V1)/(t4−t3−T1). The ignition procedure using the voltage variation rate with time (i.e., dv/dt) is easier to make ignition successful.

Afterward, it is to determine whether the ignition is successful. If no (i.e., the ignition is not successful), the step (S12) and step (S13) repeatedly perform, that is, the ignition procedure after the third cycle as shown in FIG. 3C. If yes (i.e., the ignition is successful), the ignition procedure is completed.

Figure 3D:
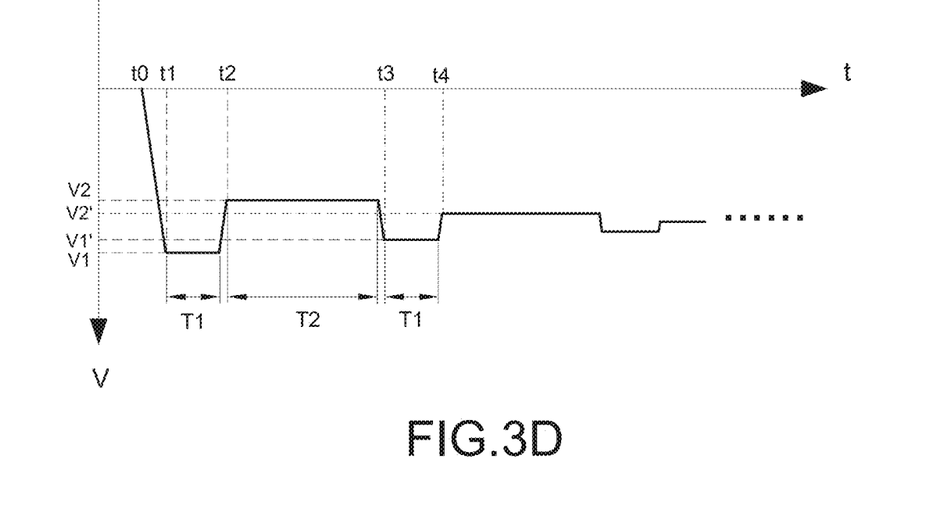
FIG. 3D is a schematic waveform of the ignition manner by the DC power source according to a fourth embodiment of the present disclosure.

Please refer to FIG. 3D, which shows a schematic waveform of the ignition manner by the DC power source according to a fourth embodiment of the present disclosure. In the embodiment shown in FIG. 3A, the first voltage V1 and the second voltage V2 are fixed, however, the first voltage V1,V1',V1" is unfixed and the second voltage V2,V2',V2" is unfixed.

As shown in FIG. 3D, at the time point t0, the ignition voltage starts softly, and at the time point t1, the ignition voltage reaches to the first voltage V1, such as −1900 volts. Afterward, the ignition voltage is increased to the second voltage V2, such as −500 volts after the first ignition time T1. In this embodiment, the ignition procedure using the voltage variation rate with time (i.e., dv/dt) is easier to make ignition successful. Therefore, a slop from the first voltage V1 to the second voltage V2 is (V2−V1)/(t2−t1 −T1).

Afterward, the ignition voltage is decreased to the first voltage V1' after the second ignition time T2. In this embodiment, since the first voltage V1 is unfixed, the first voltage V1' reached at the time point t3 is −1700 volts. Therefore, a slop from the second voltage V2 to the first voltage V1' is (V1'−V2)/(t3−t2−T2). The ignition procedure using the voltage variation rate with time (i.e., dv/dt) is easier to make ignition successful.

Afterward, the ignition voltage is increased to the second voltage V2' after the first ignition time T1. In this embodiment, since the second voltage V2 is unfixed, the second voltage V2' reached at the time point t4 is −700 volts. Therefore, a slop from the first voltage V1' to the second voltage V2' is (V2'−V1')/(t4−t3−T1). The ignition procedure using the voltage variation rate with time (i.e., dv/dt) is easier to make ignition successful.

Afterward, it is to determine whether the ignition is successful. If no (i.e., the ignition is not successful), the step (S12) and step (S13) repeatedly perform, that is, the ignition procedure after the third cycle as shown in FIG. 3D. If yes (i.e., the ignition is successful), the ignition procedure is completed.

Accordingly, the ignition method of the plasma chamber is provided to obtain a more efficient ignition procedure and protect the cavity from damage to increase the life of the cavity by using the voltage variation rate with time compared with the conventional ignition procedure using a high voltage with a single voltage magnitude.

Figure 4A:
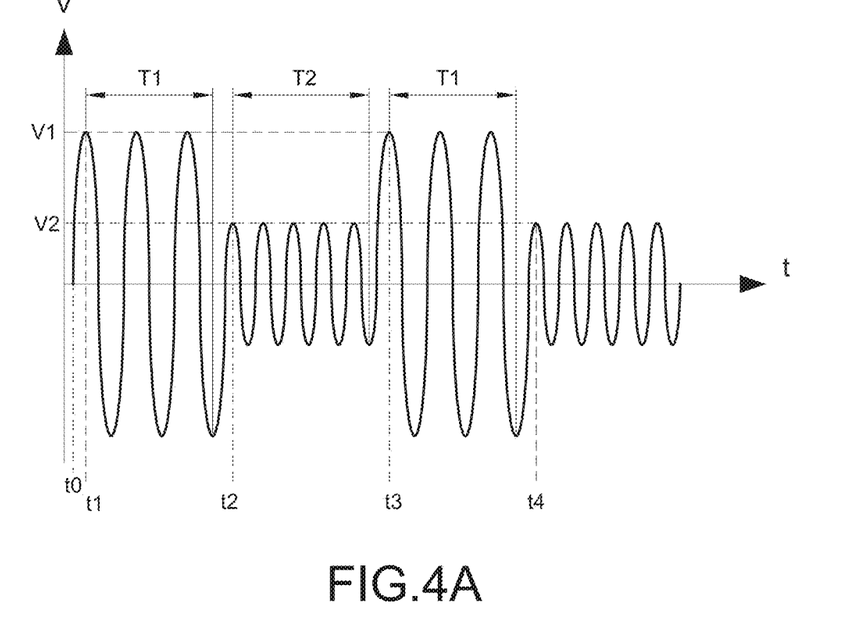
FIG. 4A is a schematic waveform of an ignition manner by a sinusoidal-wave power source according to a first embodiment of the present disclosure.

In order to facilitate the explanation of the ignition method of the present disclosure, the sinusoidal-wave power source is further taken as an example, and as shown in FIG. 4A, which is a schematic waveform of an ignition manner by a sinusoidal-wave power source according to a first embodiment of the present disclosure, and also refer to FIG. 5. The ignition method of the plasma chamber includes steps as follows. First, an ignition voltage starts softly to a first voltage (S11). In particular, the sinusoidal-wave power source uses positive and negative symmetrical voltages as an example, and only positive voltage symbols are shown in the diagram. The relationship of step (S11) corresponding to FIG. 4A is: at a time point to, the ignition voltage starts softly, and at a time point t1, the ignition voltage reaches to a first voltage V1. For example, the first voltage V1 is +1900 volts (or a voltage between +1000 volts and +1900 volts), however, this is not a limitation of the present disclosure. Afterward, when the ignition voltage reaches to the first voltage V1, the magnitude of the ignition voltage is decreased to a second voltage after a first ignition time (S12). In particular, the first ignition time T1 is 10 milliseconds (or a time between 10 milliseconds and 1000 milliseconds), however, this is not a limitation of the present disclosure. The second voltage V2 reached at a time point t2 is +500 volts (or a voltage between +500 volts and +1000 volts), however, this is not a limitation of the present disclosure. The ignition procedure using the voltage variation rate with time (i.e., dv/dt) is easier to make ignition successful compared with the conventional ignition procedure using a sinusoidal-wave high voltage with a single voltage magnitude.

Afterward, the magnitude of the ignition voltage is increased to the first voltage after a second ignition time (S13). In particular, the second ignition time T2 is 200 milliseconds (or a time between 200 milliseconds and 1000 milliseconds), however, this is not a limitation of the present disclosure. In this embodiment, the first voltage V1 is fixed, and therefore the first voltage V1 reached at a time point t3 is the above-mentioned+1900 volts. In this embodiment, a slop from the second voltage V2 to the first voltage V1 is (V1−V2)/(t3−t2−T2). The ignition procedure using the voltage variation rate with time (i.e., dv/dt) is easier to make ignition successful. In particular, a ratio between the first ignition time T1 continued by the first voltage V1 and the second ignition time T2 continued by the second voltage V2 is adjustable.

Afterward, it is to determine whether the ignition is successful (S14). If no (i.e., the ignition is not successful), the step (S12) and step (S13) repeatedly perform, that is, the ignition procedure after the second cycle as shown in FIG. 4A. If yes (i.e., the ignition is successful), the ignition procedure is completed.

Figure 4B:
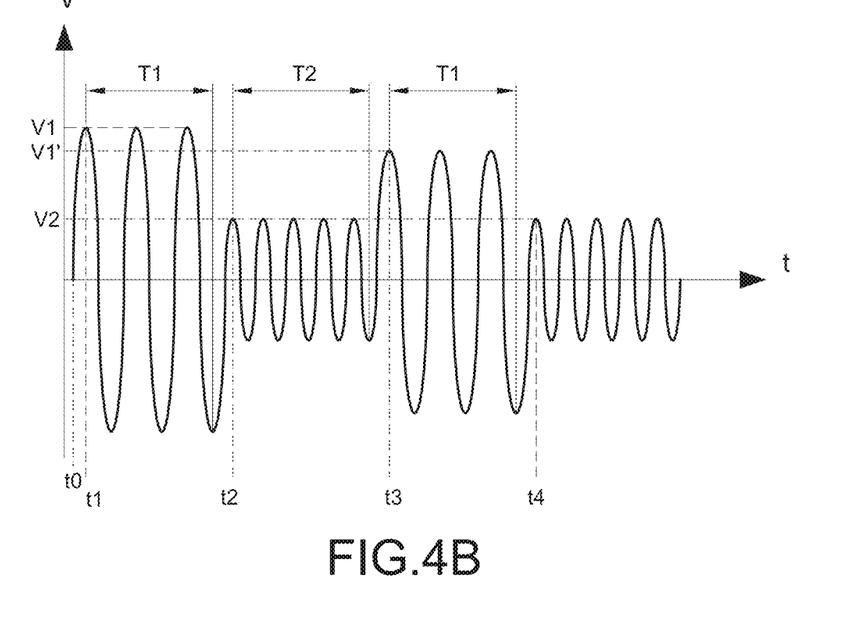
FIG. 4B is a schematic waveform of the ignition manner by the sinusoidal-wave power source according to a second embodiment of the present disclosure.

Please refer to FIG. 4B, which shows a schematic waveform of the ignition manner by the sinusoidal-wave power source according to a second embodiment of the present disclosure. In the embodiment shown in FIG. 4A, the first voltage V1 and the second voltage V2 are fixed, however, the first voltage V1,V1',V1" is unfixed but the second voltage V2 is fixed as shown in FIG. 4B.

As shown in FIG. 4B, at the time point t0, the ignition voltage starts softly, and at the time point t1, the ignition voltage reaches to the first voltage V1, such as +1900 volts. Afterward, the ignition voltage is decreased to the second voltage V2, such as +500 volts after the first ignition time T1. In this embodiment, the ignition procedure using the voltage variation rate with time (i.e., dv/dt) is easier to make ignition successful.

Afterward, the ignition voltage is increased to the first voltage V1' after the second ignition time T2. In this embodiment, since the first voltage V1 is unfixed, the first voltage V1' reached at the time point t3 is +1700 volts. The ignition procedure using the voltage variation rate with time (i.e., dv/dt) is easier to make ignition successful.

Afterward, it is to determine whether the ignition is successful. If no (i.e., the ignition is not successful), the step (S12) and step (S13) repeatedly perform, that is, the ignition procedure after the second cycle as shown in FIG. 4B. If yes (i.e., the ignition is successful), the ignition procedure is completed.

Figure 4C:
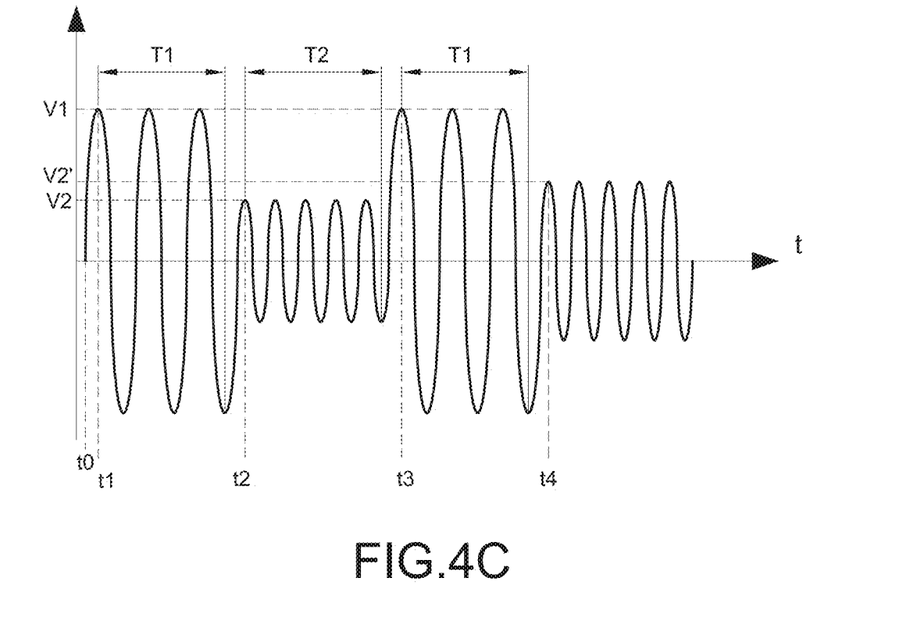
FIG. 4C is a schematic waveform of the ignition manner by the sinusoidal-wave power source according to a third embodiment of the present disclosure.

Please refer to FIG. 4C, which shows a schematic waveform of the ignition manner by the sinusoidal-wave power source according to a third embodiment of the present disclosure. In the embodiment shown in FIG. 4B, the first voltage V1,V1',V1" is unfixed but the second voltage V2 is fixed, however, the first voltage V1 is fixed but the second voltage V2,V2',V2" is unfixed as shown in FIG. 4C.

As shown in FIG. 4C, at the time point t0, the ignition voltage starts softly, and at the time point t1, the ignition voltage reaches to the first voltage V1, such as +1900 volts. Afterward, the ignition voltage is decreased to the second voltage V2, such as +500 volts after the first ignition time T1. In this embodiment, the ignition procedure using the voltage variation rate with time (i.e., dv/dt) is easier to make ignition successful.

Afterward, the ignition voltage is increased to the first voltage V1 after the second ignition time T2. In this embodiment, since the first voltage V1 is fixed, the first voltage V1 reached at the time point t3 is +1900 volts. The ignition procedure using the voltage variation rate with time (i.e., dv/dt) is easier to make ignition successful.

Afterward, the ignition voltage is decreased to the second voltage V2' after the first ignition time T1. In this embodiment, since the second voltage V2 is unfixed, the second voltage V2' reached at a time point t4 is +700 volts. The ignition procedure using the voltage variation rate with time (i.e., dv/dt) is easier to make ignition successful.

Afterward, it is to determine whether the ignition is successful. If no (i.e., the ignition is not successful), the step (S12) and step (S13) repeatedly perform, that is, the ignition procedure after the third cycle as shown in FIG. 4C. If yes (i.e., the ignition is successful), the ignition procedure is completed.

Figure 4D:
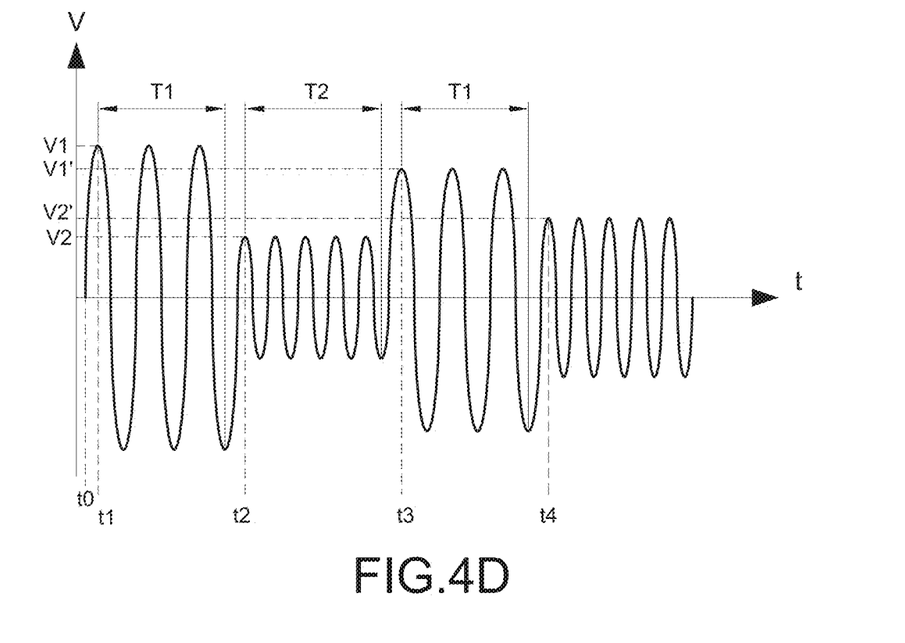
FIG. 4D is a schematic waveform of the ignition manner by the sinusoidal-wave power source according to a fourth embodiment of the present disclosure.

Please refer to FIG. 4D, which shows a schematic waveform of the ignition manner by the sinusoidal-wave power source according to a fourth embodiment of the present disclosure. In the embodiment shown in FIG. 4A, the first voltage V1 and the second voltage V2 are fixed, however, the first voltage V1,V1',V1" is unfixed and the second voltage V2,V2',V2" is unfixed as shown in FIG. 4D.

As shown in FIG. 4D, at the time point t0, the ignition voltage starts softly, and at the time point t1, the ignition voltage reaches to the first voltage V1, such as +1900 volts. Afterward, the ignition voltage is decreased to the second voltage V2, such as +500 volts after the first ignition time T1. In this embodiment, the ignition procedure using the voltage variation rate with time (i.e., dv/dt) is easier to make ignition successful.

Afterward, the ignition voltage is increased to the first voltage V1' after the second ignition time T2. In this embodiment, since the first voltage V1 is unfixed, the first voltage V1' reached at the time point t3 is +1700 volts. The ignition procedure using the voltage variation rate with time (i.e., dv/dt) is easier to make ignition successful.

Afterward, the ignition voltage is decreased to the second voltage V2' after the first ignition time T1. In this embodiment, since the second voltage V2 is unfixed, the second voltage V2' reached at a time point t4 is +700 volts. The ignition procedure using the voltage variation rate with time (i.e., dv/dt) is easier to make ignition successful.

Afterward, it is to determine whether the ignition is successful. If no (i.e., the ignition is not successful), the step (S12) and step (S13) repeatedly perform, that is, the ignition procedure after the third cycle as shown in FIG. 4D. If yes (i.e., the ignition is successful), the ignition procedure is completed.

Accordingly, the ignition method of the plasma chamber is provided to obtain a more efficient ignition procedure and protect the cavity from damage to increase the life of the cavity by using the voltage variation rate with time compared with the conventional ignition procedure using a high voltage with a single voltage magnitude.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. An ignition method of a plasma chamber comprising steps of:
   (a) starting softly an ignition voltage to a first voltage, wherein the ignition voltage is a DC voltage,
   (b) decreasing a magnitude of the ignition voltage to a second voltage after a first ignition time,
   (c) increasing the magnitude of the ignition voltage to the first voltage after a second ignition time, and
   (d) repeating the step (b) and the step (c) until the ignition is successful, wherein the latter of the magnitude of the first voltage is different from the former of the magnitude of the first voltage, or the latter of the magnitude of the second voltage is different from the former of the magnitude of the second voltage; wherein when the ignition voltage is negative, the magnitude of the first voltage is greater than the magnitude of the second voltage.

2. The ignition method of the plasma chamber in claim 1, wherein a ratio between the first ignition time continued with the first voltage and the second ignition time continued with the second voltage is adjustable.

3. The ignition method of the plasma chamber in claim 1, wherein in the repeating step, the latter of the magnitude of the first voltage is less than the former of the magnitude of the first voltage.

4. The ignition method of the plasma chamber in claim 1, wherein in the repeating step, the latter of the magnitude of the second voltage is greater than the former of the magnitude of the second voltage.

5. An ignition method of a plasma chamber comprising steps of:
   (a') starting softly an ignition voltage to a first voltage, wherein the ignition voltage is a sinusoidal-wave voltage,
   (b') decreasing a magnitude of the ignition voltage to a second voltage after a first ignition time,
   (c') increasing the magnitude of the ignition voltage to the first voltage after a second ignition time, and
   (d') repeating the step (b') and the step (c') until the ignition is successful, wherein the latter of the magnitude of the first voltage is different from the former of the magnitude of the first voltage, or the latter of the magnitude of the second voltage is different from the former of the magnitude of the second voltage; wherein a peak-to-peak value of the first voltage is greater than a peak-to-peak value of the second voltage.

6. The ignition method of the plasma chamber in claim 5, wherein in the repeating step, the latter of the peak-to-peak value of the first voltage is less than the former of the peak-to-peak value of the first voltage.

7. The ignition method of the plasma chamber in claim 5, wherein in the repeating step, the latter of the peak-to-peak value of the second voltage is greater than the former of the peak-to-peak value of the second voltage.

* * * * *